United States Patent
Arora et al.

(10) Patent No.: US 11,496,124 B1
(45) Date of Patent: Nov. 8, 2022

(54) NUMERICALLY-CONTROLLED OSCILLATOR WITH DITHERED COARSE AND FINE SPLITTER

(71) Applicant: Texas Instruments Incorporated, Dallas, TX (US)

(72) Inventors: Vinam Arora, Panchkula (IN); Srinivas Kumar Reddy Naru, Bangalore (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/488,724

(22) Filed: Sep. 29, 2021

(51) Int. Cl.
 *H03K 5/01* (2006.01)
 *G06F 1/10* (2006.01)
 *H03K 3/84* (2006.01)

(52) U.S. Cl.
 CPC .............. *H03K 5/01* (2013.01); *G06F 1/10* (2013.01); *H03K 3/84* (2013.01)

(58) Field of Classification Search
 None
 See application file for complete search history.

(56) References Cited

U.S. PATENT DOCUMENTS

| | | | |
|---|---|---|---|
| 9,100,044 B2* | 8/2015 | Mazumdar | H03M 9/00 |
| 10,009,033 B2* | 6/2018 | Malekzadeh | G06F 1/022 |
| 2007/0174371 A1* | 7/2007 | Merlo | G06F 1/022 |
| | | | 708/200 |
| 2017/0090507 A1* | 3/2017 | Wiener | A61B 18/1482 |

* cited by examiner

*Primary Examiner* — Cassandra F Cox
(74) *Attorney, Agent, or Firm* — Mark A. Valetti; Charles A. Brill; Frank D. Cimino

(57) ABSTRACT

A numerically-controlled oscillator (NCO) includes a phase accumulator (PA) which has a first input adapted to receive a phase increment, a second input adapted to receive a clock signal, and a third input adapted to receive a reset signal. The PA provides an instantaneous phase at an output. The NCO includes a dithered splitter which has an input coupled to receive the instantaneous phase. The dithered splitter dithers the instantaneous phase using a pseudo-random binary sequence (PRBS) and provides a dithered course phase and a dithered fine phase. The NCO includes a polynomial approximation unit which has a first input coupled to receive the dithered course phase and a second input coupled to receive the dithered fine phase. The polynomial approximation unit provides a sequence of numbers representing a discrete sinusoidal signal.

17 Claims, 4 Drawing Sheets

US 11,496,124 B1

NUMERICALLY-CONTROLLED OSCILLATOR WITH DITHERED COARSE AND FINE SPLITTER

TECHNICAL FIELD

The disclosure generally relates to numerically-controlled oscillators (NCOs).

BACKGROUND

A numerically-controlled oscillator (NCO) is a signal generator which generates a discrete representation of a sinusoidal waveform. NCOs are commonly used in radio frequency (RF) sampling systems, digital up/down converters, phase-locked loops and radar systems.

An NCO generally includes a phase accumulator (PA) and a phase-to-amplitude converter (PAC). The PA receives a phase increment (also known as frequency control word). At each clock input, the PA adds to a value held at its output the phase increment value. The output of the PA is an instantaneous phase (also known as phase word). The PA output is used as an index or address for a waveform lookup table (LUT) which holds coefficients of a polynomial function. The PAC may use a piecewise polynomial method which divides a horizontal axis into pieces or zones. The amplitude of segments of a sinusoidal wave (i.e., curves) in the pieces is approximated using the polynomial function.

In most communication systems, NCOs are required to have a high (e.g., 100 dB) spurious-free dynamic range (SFDR). Because the number of bits in the PA output determines the frequency resolution, the number of bits in the PA output may be increased in order to meet the SFDR requirement. Because the number of bits in the PA output sets the capacity of the LUT, an increase in the number of bits causes an increase in the size of the LUT, which leads to the NCO requiring more cell area in an integrated circuit.

SUMMARY

In one aspect, a numerically-controlled oscillator (NCO) includes a phase accumulator (PA) which has a first input adapted to receive a phase increment, a second input adapted to receive a clock signal, and a third input adapted to receive a reset signal. The PA provides an instantaneous phase at an output. The NCO includes a dithered splitter which has an input coupled to receive the instantaneous phase. The dithered splitter dithers the instantaneous phase using a pseudo-random binary sequence (PRBS) and provides a dithered course phase and a dithered fine phase. The NCO includes a polynomial approximation unit which has a first input coupled to receive the dithered course phase and a second input coupled to receive the dithered fine phase. The polynomial approximation unit provides a sequence of values representing a discrete sinusoidal signal.

In an additional aspect, the instantaneous phase has N binary bits of which M most significant bits represent a course phase and (N-M) least significant bits represent a fine phase.

In an additional aspect, the dithered splitter includes a sequence generator which provides the PRBS. The dithered splitter includes a binary adder which has a first input coupled to receive the instantaneous phase and a second input coupled to receive the PRBS. The binary adder adds the PRBS and the instantaneous phase and provides a resulting sum. The dithered splitter includes a truncator which has an input coupled to receive the resulting sum. The truncator truncates the N-M least significant bits of the resulting sum and provides the dithered course phase. The dithered splitter includes a binary subtractor which has a first input coupled to receive the instantaneous phase and a second input coupled to receive the dithered course phase. The binary substractor subtracts the dithered course phase from the instantaneous phase and provides the dithered fine phase.

In an additional aspect, the polynomial approximation unit includes a first approximation unit which has a first input coupled to receive the dithered course phase and a second input coupled to receive the dithered fine phase. The first approximation unit provides a first sequence of values representing a discrete sine wave. The polynomial approximation unit includes a second approximation unit which has a first input coupled to receive the dithered course phase and a second input coupled to receive the dithered fine phase. The second approximation unit provides a second sequence of values representing a discrete cosine wave.

In an additional aspect, the PRBS has N binary bits, wherein each M most significant bit is a binary 0, and wherein each (N-M) least significant bit has one of two possible values: binary 1 and binary 0, and wherein a probability of one of the two possible values is approximately 0.5.

In an additional aspect, a numerically-controlled oscillator (NCO) includes a phase accumulator (PA) which has a first input adapted to receive a phase increment, a second input adapted to receive a clock signal, and a third input adapted to receive a reset signal. The PA provides an instantaneous phase at an output. The NCO includes a phase-to-amplitude converter (PAC) which includes a dithered splitter having an input coupled to receive the instantaneous phase. The dithered splitter dithers the instantaneous phase using a pseudo-random binary sequence (PRBS) and provides a dithered course phase and a dithered fine phase. The PAC includes a polynomial approximation unit which has a first input coupled to receive the dithered course phase and a second input coupled to receive the dithered fine phase. The polynomial approximation unit provides a sequence of values representing a discrete sinusoidal signal.

In an additional aspect, a method of generating a sinusoidal signal includes receiving a phase increment, a clock signal and a reset signal. The method includes providing an instantaneous phase. The method includes providing a pseudo-random binary sequence (PRBS). The method includes adding the PRBS and the instantaneous phase and providing a resulting sum. The method includes truncating N-M least significant bits of the resulting sum and providing a dithered course phase. The method includes subtracting the dithered course phase from the instantaneous phase and providing a dithered fine phase. The method includes providing a sequence of values representing a discrete sinusoidal signal using a polynomial approximation, the dithered course phase and the dithered fine phase.

BRIEF DESCRIPTION OF THE DRAWINGS

FIG. 3A illustrates an instantaneous phase; FIG. 3B illustrates a pseudo-random binary sequence (PRBS); FIG. 3C illustrates a resulting sum; FIG. 3D illustrates a dithered course phase; and FIG. 3E illustrates a dithered fine phase.

The same reference numbers or other reference designators are used in the drawings to designate the same or similar (structurally and/or functionally) features.

DETAILED DESCRIPTION

Figure 1:
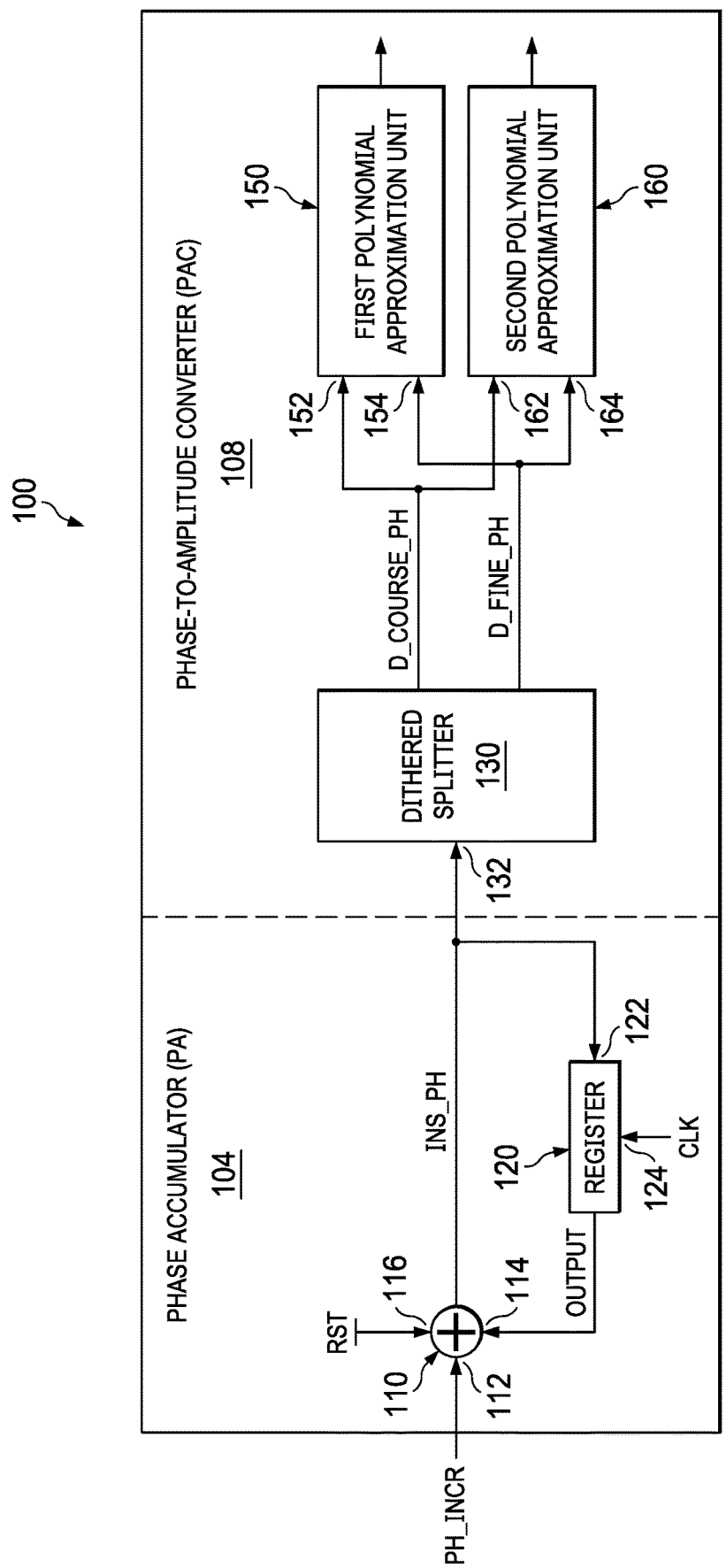
FIG. 1 is a block diagram of a numerically-controlled oscillator (NCO) of an example embodiment.

FIG. 1 is a block diagram of a numerically-controlled oscillator (NCO) 100 of an example embodiment. The NCO 100 is configured to generate a discrete representation of a sinusoidal waveform.

The NCO 100 includes: (1) a phase accumulator (PA) 104; and (2) a phase-to-amplitude converter (PAC) 108. The PA 104 includes an N-bit binary adder 110 which has a first input 112 coupled to receive a phase increment PH_INCR (also known as frequency control word, which, for example, may specify a particular signal frequency). The binary adder 110 includes a second input 114 coupled to receive a held output value OUTPUT which is the previous output of the binary adder 110 (that was stored in a register 120, for example). The binary adder 110 includes a third input 116 coupled to receive a reset signal RST.

The PA 104 includes the register 120 which has a first input 122 coupled to receive the output from the binary adder 110. The register 120 has a second input 124 coupled to receive a clock signal CLK. With each clock cycle, the register 120 provides the held value at an output 126. The binary adder 110 sums OUTPUT obtained from the register 120 with the phase increment PH_INCR. Thus, the binary adder 110 produces a new output in each clock cycle consisting of the previous output OUTPUT obtained from the register 120 summed with the phase increment PH_INCR. The output of the binary adder 100 follows a rising staircase pattern with a step size equal to the phase increment PH_INCR. However, each reset signal RST sets the binary adder 110 to an initial value (e.g., 0), and the process starts over again. The resulting output of the PA 104 is known as an instantaneous phase INS_PH signal or phase word which resembles a sawtooth waveform having a slope (gradient) equal to the phase increment PH_INCR. The instantaneous phase INS_PH is an N-bit binary sequence of which a first set of bits represent a course phase COURSE_PH and a second set of bits represent a fine phase FINE_PH. In an example embodiment, M most significant bits of the N-bit binary sequence are assigned to represent the course phase COURSE_PH and N minus M (N-M) least significant bits are assigned to represent the fine phase FINE_PH.

The PAC 108 includes a dithered splitter 130 which has an input 132 (that may be N bits wide) coupled to receive the instantaneous phase INS_PH which consists of the course phase COURSE_PH and the fine phase FINE_PH. The output of the adder 110 (and, thereby, the connection between the adder 110 and the PAC 108) may be N-bits wide or it may be a single output/conductor with the N-bits provided serially. The dithered splitter 130 dithers the instantaneous phase INS_PH by adding a pseudo-random binary sequence (PSBR) to the instantaneous phase INS_PH and separates the dithered phase into a dithered course phase D_COURSE_PH and a dithered fine phase D_FINE_PH.

The PAC 108 includes a first polynomial approximation unit 150 which has a first input 152 coupled to receive the dithered course phase D_COURSE_PH, and a second input 154 coupled to receive the dithered fine phase D_FINE_PH. The first polynomial approximation unit 150 provides a first sequence of values (e.g., numbers) representing a discrete sine wave.

The PAC 108 includes a second polynomial approximation unit 160 which has a first input 162 coupled to receive the dithered course phase D_COURSE_PH, and a second input 164 coupled to receive the dithered fine phase D_FINE_PH. The second polynomial approximation unit 150 provides a second sequence of values (e.g., numbers) representing a discrete cosine wave.

Thus, the PAC 108 provides an in-phase output (sine wave) and a quadrature output (cosine wave). The quadrature output leads the in-phase output by 90 degrees. Because the in-phase and quadrature outputs are orthogonal with respect to each other, they are used in communication systems (e.g., transceiver, up/down converter, radar) to increase data throughput.

Modifications to the NCO 100 within the scope of the disclosure are possible. Although the NCO 100 of FIG. 1 is shown having the first and second polynomial approximation units, 140 and 150, the NCO 100 can be designed with only a single polynomial approximation unit.

Figure 2:
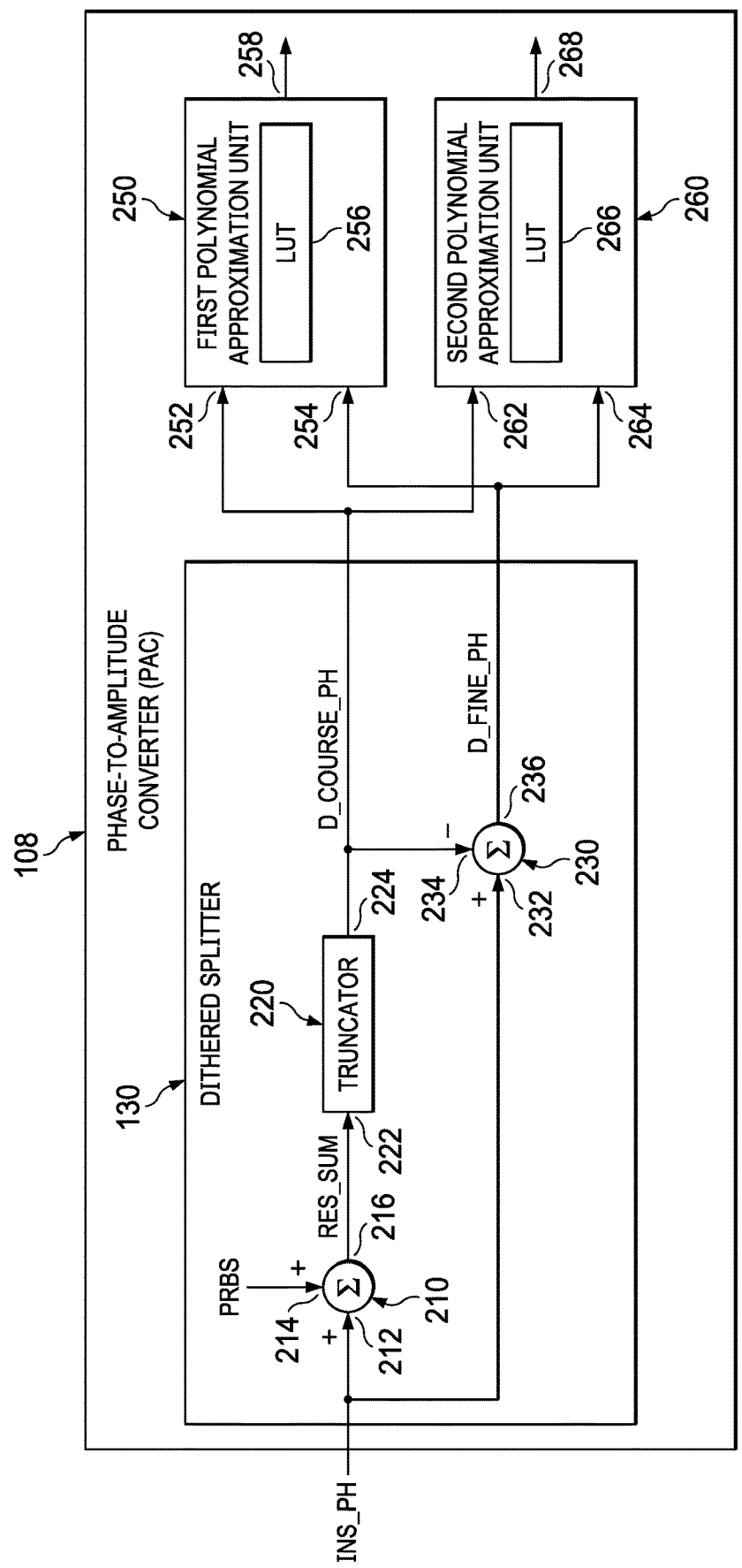
FIG. 2 is a block diagram of a phase-to-amplitude converter (PAC) of an example embodiment.

FIG. 2 is a block diagram of the PAC 108 of an example embodiment. The PAC 108 includes the dithered splitter 130 which includes a binary adder 210, a truncator 220 and a binary subtractor 230. The binary adder 210 has a first input 212 coupled to receive the instantaneous phase INS_PH from the PA 104 (shown in FIG. 1). As discussed above, the instantaneous phase INS_PH comprises the course phase COURSE_PH and the fine phase FINE_PH. The binary adder 210 has a second input 214 coupled to receive a pseudo-random binary sequence (PRBS). The PRBS is a pseudo-random binary code which is generated by a pseudo-random generator (not shown in FIG. 2) using a deterministic algorithm.

In an example embodiment, the PRBS is an N-bit binary sequence of which each bit of M most significant bits is a binary 0, and each bit of the (N-M) least significant bits has one of two possible values: binary 1 and binary 0. The probability of any bit of the (N-M) least significant bits having any one of two possible values is 0.5.

The binary adder 210 dithers the instantaneous phase INS_PH by adding PRBS and INS_PH and provides a resulting sum RES_SUM at an output 216.

The truncator 220 has an input 222 to receive the output of the adder 210 (i.e., RES_SUM). The truncator 220 truncates the (N-M) least significant bits RES_SUM and provides the dithered course phase D_COURSE_PH at an output 224. For example, if RES_SUM is an N-bit binary sequence of which M most significant bits are assigned to represent D-COURSE_PH, the truncator 220 truncates the (N-M) least significant bits and provides (at output 224) the M most significant bits as the D_COURSE_PH signal.

The binary subtractor 230 has a first input 232 coupled to receive the instantaneous phase INS_PH from the PA 104. The binary subtractor 230 has a second input 234 coupled to receive the dithered course phase D_COURSE_PH from the truncator 220. The binary subtractor 230 subtracts D_COURSE_PH from INS_PH and provides the dithered fine phase D_FINE_PH at an output 236.

In an example embodiment, if M most significant bits of the PA 104's output (i.e., INS_PH) represent COURSE_PH, then each bit of M most significant bits of the PRBS is 0. For example, INS_PH may be a 11-bit binary sequence of which 4 most significant bits are assigned to represent COURSE_PH and 7 least significant bits are assigned to represent FINE_PH. Then, each bit of the 4 most significant bits of the PRBS is 0, and each bit of the (N-M) least significant bits of the PRBS has one of two possible values: binary 1 and binary 0. The probability of each bit of the (N-M) least significant bits having any one of two possible values is approximately 0.5 (e.g. there is a 50% chance of a "1" and a 50% chance of a "0").

If M most significant bits of PRBS are set to 0, the range of D_FINE_PH is limited between $[-2^{(N-M)}]$ and $[2^{(N-M)}-1]$. Because the range of D_FINE_PH determines the size of arithmetic blocks in the polynomial computation units, it is desirable to keep the range of D_FINE_PH as small as possible.

Figure 3A:
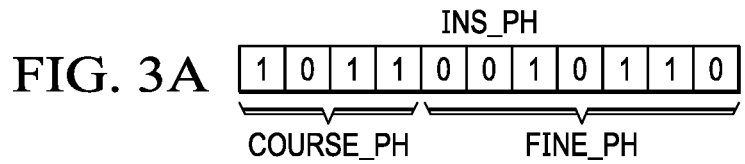
FIGS. 3A-3E illustrate example bit sequences of example embodiments.

FIG. 3A illustrates an 11-bit instantaneous phase INS_PH (10110010110) of which four most significant bits are assigned to represent COURSE_PH and 7 least significant bits are assigned to represent FINE_PH. The number of bits of COURSE_PH determines the size of the look-up table (LUT) used in the piecewise approximation method and also determines the size of zones/pieces used in the piecewise approximation. If the number of bits of COURSE_PH is increased, the size of the LUT is increased, thus requiring more area in a semiconductor die to implement the LUT. The advantage of increasing the bits of COURSE_PH is that the size of the zone is decreased, which requires less complex circuitry for the approximation.

Conversely, if the number of bits of COURSE_PH is decreased, the size of the LUT is decreased, which requires less area in a semiconductor die. The drawback of decreasing the number of bits of COURSE_PH is that the size of the zone is increased, which requires more complex circuitry for the approximation.

Figure 3B:
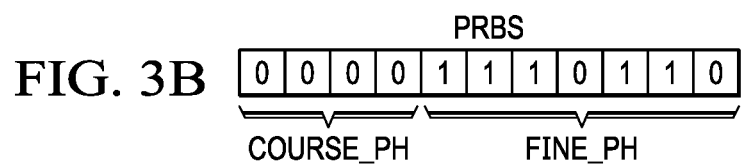
Figure 3C:
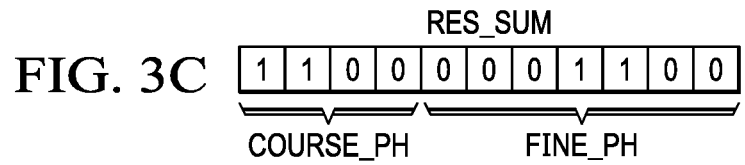
Figure 3D:
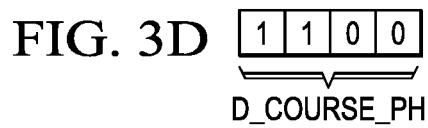
Figure 3E:
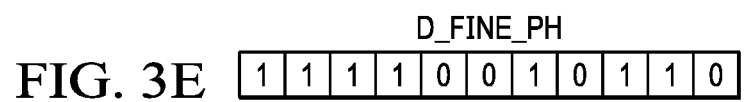

FIG. 3B illustrates an 11-bit PRBS (00001110110) which is used to dither INS_PH. Because four most significant bits of INS_PH are assigned to represent COURSE_PH, each bit of the four most significant bits of PRBS is set to "0". Also, since seven least significant bits of INS_PH are assigned to represent FINE_PH, each bit of the 7 least significant bits of PRBS is set to one of two possible values: binary "1" or binary "0". The probability of each bit of the seven least significant bits having any one of two possible values is 0.5. FIG. 3C illustrates the resulting sum RES_SUM (11000001100) obtained by adding PRBS and INS_PH. FIG. 3D illustrates the dithered course phase D_COURSE_PH (1100) obtained by truncating the seven least significant bits of the resulting sum RES_SUM. FIG. 3E illustrates the dithered fine phase D_FINE_PH (11110010110) obtained by subtracting D_COURSE_PH from INS_PH.

With reference to FIG. 2, the PAC 108 includes a first polynomial approximation unit 250 which has a first input 252 coupled to receive the dithered course phase D_COURSE_PH and a second input 254 coupled to receive the dithered fine phase D_FINE_PH. In an example embodiment, the first polynomial approximation unit 250 includes a waveform lookup table (LUT) 256 (which may include a transitory memory, one or more registers, digital logic circuitry and/or any other type of memory) which stores coefficients (e.g., C0, C1, C2) for a second order polynomial function. The dithed course phase D_COURSE_PH is used to address and retrieve the coefficients from the LUT 256. A sine wave is approximated using the coefficients and the dithered fine phase D_FINE_PH. In an example embodiment, first polynomial approximation unit 250 uses the following second order polynomial to generate a first sequence of numbers which approximates a discrete sine wave:

$$f(x)=C0+C1*D\_FINE\_PH+C2*D\_FINE\_PH2$$

The first polynomial approximation unit 250 provides the first sequence of numbers at an output 258.

The PAC 108 includes a second polynomial approximation unit 260 which has a first input 262 coupled to receive the dithered course phase D_COURSE_PH and a second input 264 coupled to receive the dithered fine phase D_FINE_PH.

In an example embodiment, the second polynomial approximation unit 260 includes a waveform lookup table (LUT) 266 (which may include a transitory memory, one or more registers, digital logic circuitry and/or any other type of memory) which stores coefficients (e.g., D0, D1, D2). The dithered course phase D_COURSE_PH is used to address and retrieve the coefficients from the LUT 266. A cosine wave is approximated using the coefficients and the dithered fine phase D_FINE_PH. In an example embodiment, second polynomial approximation unit 260 uses the following second order polynomial to generate a second sequence of numbers approximating a discrete cosine wave:

$$f(x)=D0+D1*D\_FINE\_PH+D2*D\_FINE\_PH2$$

The second polynomial approximation unit 260 provides the second sequence of numbers at an output 268.

The first and second polynomial approximation units 250 and 260, or parts thereof, may be implemented in hardware (e.g., logic circuitry, memory, microprocessor, application-specific-integrated-circuit and/or other processing circuitry), firmware and/or software.

The output of a phase accumulator typically includes quantization errors which introduce distortions (i.e., quantization noise) to the output of an NCO. By dithering the output of the PA 104 using the PRBS, distortions in the output of the NCO 100 are randomized. Thus, distortions in the output of the NCO 100 are replaced with random noise. As a result, the SFDR of the NCO 100 is improved. As discussed above, the SFDR of an NCO is typically improved by increasing the size of the LUT, which increases the cell area of the NCO. Because, the SFDR of the NCO 100 is improved by dithering the output of the PA 104, LUTs of smaller size can utilized in the example embodiments and still meet the required SFDR. The effect of this is that the cell area of the NCO 100 that achieves a given SFDR is reduced.

In accordance with the concepts disclosed herein, a test version of NCO 100 having the dithered splitter 130 was fabricated using a 28 nm fabrication process. This fabricated NCO meets the following specifications:

SNR=94 dB
SFDR=100 dB
Clock=1.25 GHz

Because of the advantages of having the dithered splitter 130, the fabricated NCO required only 1928 um² cell area in order to meet the above specifications. In contrast, a conventional NCO requires approximately 2597 um² cell area to meet the similar specifications. Thus, the cell area required by the NCO of some example embodiments, which meets the above specifications, is approximately 26% less than the cell area required by a conventional NCO.

Figure 4:
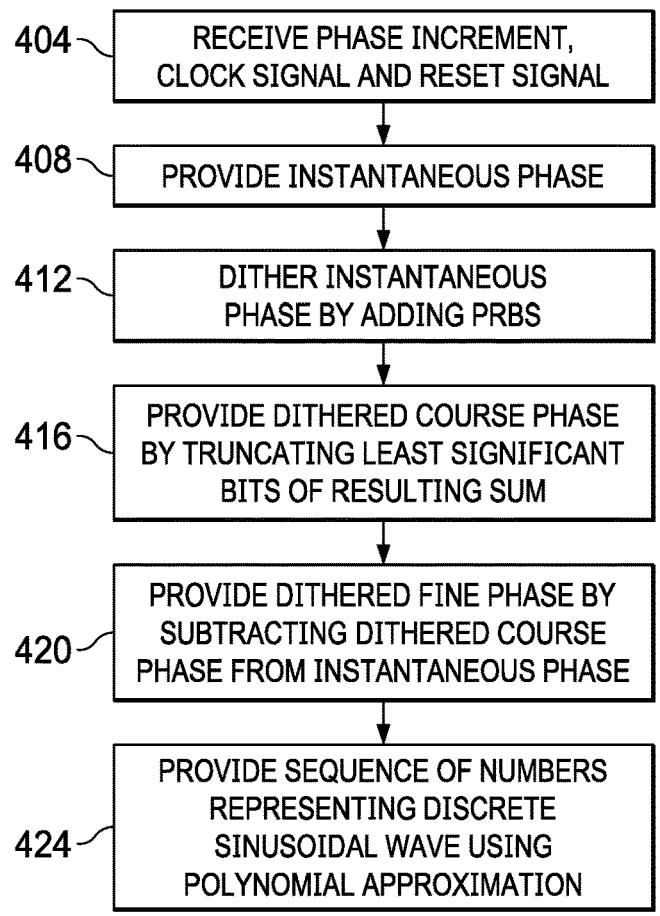
FIG. 4 is a flow diagram of a process of an example embodiment.

FIG. 4 is a flow diagram of a process of an example embodiment. In block 404, a phase increment, a clock signal and a reset signal are received (by PA 104, for example). In block 408, an instantaneous phase (e.g. INS_PHS) is provided based on the phase increment (e.g. PH_INCR), the clock signal (e.g. CLK) and the reset signal (e.g. RST).

In block 412, the instantaneous phase is dithered by adding a PRBS and the instantaneous phase and a resulting sum (e.g. RES_SUM) is provided. In an example embodiment, a binary adder (e.g. adder 210) adds the PRBS to the instantaneous phase and provides the resulting sum.

In block 416, a dithered course phase signal (e.g. D_COURSE_PH) is provided by truncating the (N-M) least significant bits of the resulting sum. In block 420, a dithered fine phase signal (D_FINE_PH) is provided by subtracting the dithered course phase from the instantaneous phase. In an example embodiment, a binary subtractor (e.g. subtractor 230) subtracts the dithered course phase from the instantaneous phase and provides the dithered fine phase. In block 424, a sequence of values (e.g. numbers) representing a discrete sinusoidal wave (e.g. at outputs 258 and/or 268) is provided using polynomial approximation, the dithered course phase, and the dithered fine phase. In an example embodiment, a second order polynomial function is used to generate the sequence of numbers.

Figure 5:
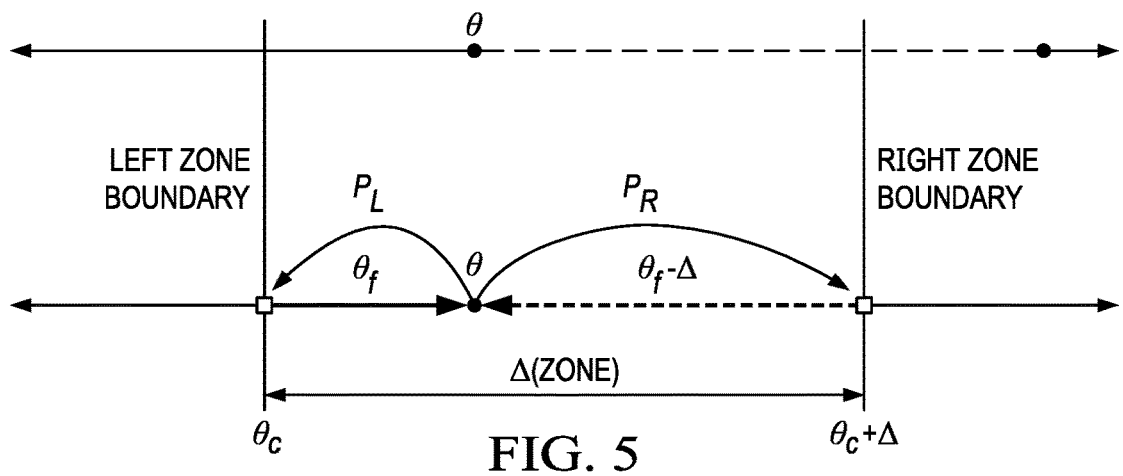
FIG. 5 illustrates a probabilistic view of outputs of a dithered splitter of an example embodiment.

FIG. 5 illustrates a probabilistic view of the outputs (D-COURSE_PH and D_FINE_PH) of the dithered splitter 130 in accordance with an example embodiment. In FIG. 5, Delta ($\Delta$) represents a zone size shown by left and right boundaries, Theta ($\theta$) represents instantaneous phase, Theta$_c$ ($\theta_c$) represents course phase, and Theta$_f$ ($\theta_f$) represents fine phase. Depending on the PRBS at any instant, the outputs of the dithered splitter 130 will be:

D_COURSE_PH=COURSE_PH and
D_FINE_PH=FINE_PH with a probability of $P_L$; or
D_COURSE_PH=(COURSE_PH+$\Delta$) and
D_FINE_PH=(FINE_PH-$\Delta$) with a probability of $P_R$.

The probabilities $P_L$ and $P_R$ depend on the instantaneous phase $\theta$. If the probability is $P_L$, the approximated sinusoid has an error $E_L$ (not shown in FIG. 5), and if the probability is $P_R$, the approximated sinusoid has an error $E_R$ (not shown in FIG. 5). The mean error $E_M=(P_L*E_L+P_R*E_R)$. Generally, $E_L$ and $E_R$ have opposite signs, which leads to a smaller $E_M$.

In this description, the term "couple" may cover connections, communications, or signal paths that enable a functional relationship consistent with this description. For example, if device A provides a signal to control device B to perform an action, then: (a) in a first example, device A is coupled to device B; or (b) in a second example, device A is coupled to device B through intervening component C if intervening component C does not substantially alter the functional relationship between device A and device B, such that device B is controlled by device A via the control signal provided by device A. Also, in this description, a device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof. Furthermore, in this description, a circuit or device that includes certain components may instead be adapted to be coupled to those components to form the described circuitry or device. For example, a structure described as including one or more semiconductor elements (such as transistors), one or more passive elements (such as resistors, capacitors and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, such as by an end-user and/or a third party.

As used herein, the terms "terminal", "node", "interconnection" and "pin" are used interchangeably. Unless specifically stated to the contrary, these terms are generally used to mean an interconnection between or a terminus of a device element, a circuit element, an integrated circuit, a device or other electronics or semiconductor component.

While certain components may be described herein as being of a particular process technology, these components may be exchanged for components of other process technologies. Circuits described herein are reconfigurable to include the replaced components to provide functionality at least partially similar to functionality available before the component replacement. Components shown as resistors, unless otherwise stated, are generally representative of any one or more elements coupled in series and/or parallel to provide an amount of impedance represented by the shown resistor. For example, a resistor or capacitor shown and described herein as a single component may instead be multiple resistors or capacitors, respectively, coupled in series or in parallel between the same two nodes as the single resistor or capacitor. Also, uses of the phrase "ground terminal" in this description include a chassis ground, an Earth ground, a floating ground, a virtual ground, a digital ground, a common ground, and/or any other form of ground connection applicable to, or suitable for, the teachings of this description. Unless otherwise stated, "about", "approximately", or "substantially" preceding a value means +/–10 percent of the stated value.

While certain elements may be included in an integrated circuit and other elements are external to the integrated circuit, additional or fewer features may be incorporated into the integrated circuit in other example embodiments. In addition, some or all of the features illustrated as being external to the integrated circuit may be included in the integrated circuit and/or some features illustrated as being internal to the integrated circuit may be incorporated outside of the integrated. As used herein, the term "integrated circuit" means one or more circuits that are: (i) incorporated in/over a semiconductor substrate; (ii) incorporated in a single semiconductor package; (iii) incorporated into the same module; and/or (iv) incorporated in/on the same printed circuit board.

Modifications are possible in the described embodiments, and other embodiments are possible, within the scope of the claims.

What is claimed is:

1. A numerically-controlled oscillator (NCO), comprising:
 a phase accumulator (PA) having a first input adapted to receive a phase increment, a second input adapted to receive a clock signal, and a third input adapted to receive a reset signal, the PA operable to provide an instantaneous phase at an output;
 a dithered splitter having an input coupled to output of the PA, the dithered splitter having a first output and a second output and operable to dither the instantaneous phase using a pseudo-random binary sequence (PRBS) and provide a dithered course phase at the first output and a dithered fine phase at the second output; and a polynomial approximation unit having a first input coupled to the first output and a second input coupled to the second output, the polynomial approximation unit operable to provide a sequence of values representing a discrete sinusoidal signal.

2. The NCO of claim 1, wherein the instantaneous phase has N binary bits of which the M most significant bits represent a course phase and the (N-M) least significant bits represent a fine phase.

3. The NCO of claim 2, wherein the dithered splitter comprises:
   a sequence generator operable to provide the PRBS;
   a binary adder having a first input coupled to receive the instantaneous phase and a second input coupled to receive the PRBS, the binary adder operable to add the PRBS and the instantaneous phase and provide a resulting sum;
   a truncator having an input coupled to receive the resulting sum and operable to truncate the (N-M) least significant bits of the resulting sum to provide the dithered course phase; and
   a binary subtractor having a first input coupled to receive the instantaneous phase and a second input coupled to receive the dithered course phase, the binary subtractor operable to subtract the dithered course phase from the instantaneous phase to provide the dithered fine phase.

4. The NCO of claim 2, wherein the polynomial approximation unit comprises:
   a first approximation unit having a first input coupled to receive the dithered course phase and a second input coupled to receive the dithered fine phase, the first approximation unit operable to provide a first sequence of values representing a discrete sine wave; and
   a second approximation unit having a first input coupled to receive the dithered course phase and a second input coupled to receive the dithered fine phase, the second approximation unit operable to provide a second sequence of values representing a discrete cosine wave.

5. The NCO of claim 1, wherein the PRBS has N binary bits, and wherein each M most significant bit is a binary 0, and wherein each (N-M) least significant bit has one of two possible values: binary 1 and binary 0, and wherein a probability of one of the two possible values is approximately 0.5.

6. A numerically-controlled oscillator (NCO), comprising:
   a phase accumulator (PA) having a first input adapted to receive a phase increment, a second input adapted to receive a clock signal, and a third input adapted to receive a reset signal, the PA operable to provide an instantaneous phase at an output; and
   a phase-to-amplitude converter (PAC) including a dithered splitter having an input coupled the output of the PA and operable to dither the instantaneous phase using a pseudo-random binary sequence (PRBS) and generate a dithered course phase signal and a dithered fine phase signal, the PAC having a polynomial approximation unit operable to provide a sequence of values representing a discrete sinusoidal signal in response to the dithered course phase signal and the dithered fine phase signal.

7. The NCO of claim 6, wherein the instantaneous phase has N binary bits of which the M most significant bits represent a course phase and the (N-M) least significant bits represent a fine phase.

8. The NCO of claim 6, wherein the dithered splitter comprises:
   a sequence generator operable to provide the PRBS;
   a binary adder having a first input coupled to receive the instantaneous phase and a second input coupled to receive the PRBS, the binary adder operable to add the PRBS and the instantaneous phase and provide a resulting sum;
   a truncator having an input coupled to receive the resulting sum and operable to truncate the (N-M) least significant bits of the resulting sum to provide the dithered course phase; and
   a binary subtractor having a first input coupled to receive the instantaneous phase and a second input coupled to receive the dithered course phase, the binary subtractor operable to subtract the dithered course phase from the instantaneous phase to provide the dithered fine phase.

9. The NCO of claim 6, wherein the polynomial approximation unit comprises:
   a first approximation unit having a first input coupled to receive the dithered course phase and a second input coupled to receive the dithered fine phase, the first approximation unit operable to provide a first sequence of values representing a discrete sine wave; and
   a second approximation unit having a first input coupled to receive the dithered course phase and a second input coupled to receive the dithered fine phase, the second approximation circuit operable to provide a second sequence of values representing a discrete cosine wave.

10. The NCO of claim 8, wherein the PRBS has N binary bits, and wherein each M most significant bit is a binary 0, and wherein each N-M least significant bit has one of two possible values: binary 1 and binary 0, and wherein the probability of one of the two possible values is approximately 0.5.

11. A numerically-controlled oscillator (NCO), comprising:
   a phase accumulator (PA) having a first input adapted to receive a phase increment, a second input adapted to receive a clock signal, and third input adapted to receive a reset signal, the PA operable to provide an instantaneous phase at an output;
   a sequence generator operable to provide a pseudo-random binary sequence (PRBS) at a PRBS output;
   a binary adder having a first input coupled to the output of the PA and having a second input coupled to the PSBR output, the binary adder operable to add the PRBS and the instantaneous phase and provide a resulting sum at an adder output;
   a truncator having an input coupled to the adder output and operable to truncate at least one least significant bits of the resulting sum to provide a dithered course phase at a truncator output; and
   a binary subtractor having a first input coupled to the PA output and having a second input coupled to the truncator output, the binary subtractor operable to subtract the dithered course phase from the instantaneous phase to provide a dithered fine phase at a subtractor output; and
   a polynomial approximation unit having a first input coupled to the truncator output and a second input coupled to the subtractor output, the polynomial approximation unit operable to provide a sequence of values representing a discrete sinusoidal signal.

12. The NCO of claim 11, wherein the instantaneous phase has N binary bits of which the M most significant bits represent a course phase and the (N-M) least significant bits represent a fine phase.

13. The NCO of claim 11, wherein the polynomial approximation unit comprises:
   a first approximation unit having a first input coupled to receive the dithered course phase and a second input coupled to receive the dithered fine phase, the first approximation unit operable to provide a first sequence of values representing a discrete sine wave; and
   a second approximation unit having a first input coupled to receive the dithered course phase and a second input coupled to receive the dithered fine phase, the second approximation circuit operable to provide a second sequence of values representing a discrete cosine wave.

14. The NCO of claim 11, wherein the PRBS has N binary bits, and wherein each M most significant bit is a binary 0, and wherein each (N-M) least significant bit has one of two possible values: binary 1 and binary 0, and wherein the probability of one of the two possible values is approximately 0.5.

15. A method of generating a sinusoidal signal, comprising:
   receiving a phase increment, a clock signal and a reset signal;
   providing an instantaneous phase by a phase accumulator (PA);
   adding a pseudo random binary sequence (PRBS) and the instantaneous phase and providing a resulting sum;
   truncating at least one least significant bits of the resulting sum and providing a dithered course phase;
   subtracting the dithered course phase from the instantaneous phase and providing a dithered fine phase; and
   providing a sequence of values representing a discrete sinusoidal signal using a polynomial approximation, the dithered course phase and the dithered fine phase.

16. The method of claim 15, wherein the instantaneous phase has N binary bits of which the M most significant bits represent a course phase and the (N-M) least significant bits represent a fine phase.

17. The method of claim 15, wherein the PRBS has N binary bits, and wherein each M most significant bit is a binary 0, and wherein each (N-M) least significant bit has one of two possible values: binary 1 and binary 0, and wherein a probability of one of the two possible values is approximately 0.5.

* * * * *